United States Patent
Oh

(10) Patent No.: US 12,025,848 B2
(45) Date of Patent: Jul. 2, 2024

(54) ASSEMBLY STRUCTURE FOR VEHICLE CAMERA MODULE USING SOLDER-JET

(71) Applicant: HYUNDAI MOBIS Co., Ltd., Seoul (KR)

(72) Inventor: SangHwan Oh, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 217 days.

(21) Appl. No.: 17/076,427

(22) Filed: Oct. 21, 2020

(65) Prior Publication Data

US 2021/0318507 A1 Oct. 14, 2021

(30) Foreign Application Priority Data

Apr. 8, 2020 (KR) .................. 10-2020-0042519

(51) Int. Cl.
*G03B 30/00* (2021.01)
*G02B 7/00* (2021.01)
(Continued)

(52) U.S. Cl.
CPC ............. *G02B 7/003* (2013.01); *G02B 7/02* (2013.01); *G03B 30/00* (2021.01); *H04N 23/51* (2023.01); *H04N 23/54* (2023.01); *H04N 23/55* (2023.01); *H05K 1/115* (2013.01); *H05K 3/306* (2013.01); *H05K 3/4076* (2013.01); *H05K 2201/09545* (2013.01); *H05K 2201/10151* (2013.01); *H05K 2203/04* (2013.01); *H05K 2203/107* (2013.01)

(58) Field of Classification Search
CPC . G02B 7/00; G02B 7/02; G03B 30/00; H05K 3/30; H05K 3/40; H05K 1/11; H04N 5/225
See application file for complete search history.

(56) References Cited

U.S. PATENT DOCUMENTS 10,293,441 B2 5/2019 Kang
2007/0212061 A1 9/2007 Woo
(Continued)

FOREIGN PATENT DOCUMENTS

JP 2018073957 5/2018
KR 10-2007-0092545 9/2007
(Continued)

*Primary Examiner* — Dave Czekaj
*Assistant Examiner* — Berteau Joisil
(74) *Attorney, Agent, or Firm* — NSIP Law

(57) ABSTRACT

Provided is a vehicle camera module including a lens, circuit board having an image sensor, front housing, and rear housing. The lens has a lens barrel and lens elements assembled. The front housing has front and rear sides to which the lens and the circuit board are assembled, respectively. The rear housing is coupled rearwardly of the front housing to seal the lens and circuit board. The front housing includes posts protruding rearward and a pin protruding distally of the post and having a smaller cross-sectional area than the post. The circuit board includes a plated through-hole configured to at least partially receive the pin. The front housing and circuit board are pre-assembled such that pin and plated through-hole have an assembly clearance, the lens and image sensor are optically aligned in a pre-assembled state, and the assembly clearance is fixedly soldered through a laser solder-jet bonding process.

13 Claims, 34 Drawing Sheets

(51) Int. Cl.
*G02B 7/02* (2021.01)
*H04N 23/51* (2023.01)
*H04N 23/54* (2023.01)
*H04N 23/55* (2023.01)
*H05K 1/11* (2006.01)
*H05K 3/30* (2006.01)
*H05K 3/40* (2006.01)

(56) References Cited

U.S. PATENT DOCUMENTS

2018/0332200 A1* 11/2018 Sesti ................. G02B 7/04
2021/0232021 A1* 7/2021 Park ................. G03B 17/08

FOREIGN PATENT DOCUMENTS

| KR | 10-1022870 | 3/2011 |
| KR | 101022870 B1 * | 3/2011 |
| KR | 10-14093220000 | 6/2014 |
| KR | 10-2018-0000126 | 1/2018 |

* cited by examiner (a)

(b)

ASSEMBLY STRUCTURE FOR VEHICLE CAMERA MODULE USING SOLDER-JET

CROSS-REFERENCE TO RELATED APPLICATIONS

This application claims priority from and the benefit of Korean Patent Application No. 10-2020-0042519, filed Apr. 8, 2020, which is hereby incorporated by reference for all purposes as if set forth herein.

BACKGROUND

Field

Exemplary embodiments relate to a camera assembly structure for use with a vehicle. More specifically, the inventive concepts relate to an assembly structure upon an optical alignment of a lens and an image sensor by using a solder jet.

Discussion of the Background

The statements in this section merely provide background information related to the inventive concepts and do not necessarily constitute prior art.

Newly released automobiles include at least one camera, and a higher number of cameras are used in more luxurious vehicles. For example, vehicles equipped with a parking assist system use an increasing number of cameras mounted to capture a broad range around an automobile.

The camera is an essential component for an Advanced Driver Assistance System (ADAS) and an autonomous vehicle. Examples of ADAS include Autonomous Emergency Braking (AEB), Forward Collision Assist (FCA), Forward Collision Warning (FCW), Lane Keep Assist (LKA), Lane Departure Warning (LDW), Lane Following Assist (LFA), Lane Keeping Assistant System (LKAS), Active Blind Spot Detection (ABSD), Around View Monitoring (AVM), Low Beam Assist (LBA), Driver Attention Warning (DAW), and Smart Cruise Control (SCC) among others.

According to the National Highway Traffic Safety Administration (NHTSA), major automakers are planning to introduce a front-end collision warning function and an automatic brake function as basic specifications for new cars from the year 2022. Cameras are a major component category of autonomous driving systems, along with radar and light detection and ranging (LiDAR). Obstacles, lanes, road signs, and traffic signals are often better detected by cameras than radar or LiDAR.

A vehicle camera is supplied in the form of a single module in which an image sensor and a lens are assembled. In the process of attaching the image sensor to a circuit board, or in the process of assembling a plurality of lens elements to a lens barrel, the optical axis alignment may be distorted. Providing an incorrect image due to the misaligned optical axis deteriorates the performance of the parking guide or automatic driving. Therefore, each camera module is subjected to a 6-axis optical alignment before fixing the lens and the image sensor to each other to ensure a targeted optical performance.

On the other hand, a polymer adhesive is mainly used for fixing after the alignment. The polymer adhesive exhibits properties in the curing process, such as dimensional changes, slow curing rates, and low glass transition temperatures. The dimensional changes and slow curing rates lead to quality and productivity degradations. When the operational temperature of the camera gets close to the glass transition temperature of the polymer adhesive, the adhesive site may be deformed, and the accuracy of the optical axis alignment may deteriorate. Therefore, to provide a high-performance camera module with high reliability, there is a need for an improved camera assembly structure capable of ensuring accurate optical axis alignment.

FIGS. 1A and 1B are exploded perspective views of two conventional camera module assembly structures.

FIGS. 1A and 1B illustrate vehicle camera modules 1 and 1' that each includes a lens 10 at the front, close to the subject area, a front housing 20, a circuit board 30, and a rear housing 50 arranged in this order.

The lens 10 is assembled by fixing a plurality of lens elements 100 in a lens barrel 110, and closing the front of the lens barrel 110 with a retainer 120. The lens 10 is pre-assembled in the front housing 20, and an image sensor 40 is mounted on the circuit board 30. The front housing 20 and the circuit board 30 are assembled after being optically aligned to correct an assembly error between the lens 10 and the image sensor 40. The camera modules 1 and 1' are received and sealed in the front housing 20 and the rear housing 50 so that the lens 10 and the circuit board 30 are prevented from being contaminated by the external environment.

The high-resolution image sensor is very precise that the pixel pitch is only a few microns. However, when compared with the resolution of the image sensor 40, relatively large assembly errors are introduced between the plurality of lens elements 100, the lens barrel 110, the front housing 20, the image sensor 40, and the circuit board 30 where they are assembled. Typically, the image sensor 40 forms a ball grid array (BGA, not illustrated) on the circuit board 30 and is soldered by a reflow process, but errors such as an uneven deformation of the BGA in this process may distort the position of the image sensor 40. When using a conductive adhesive (not illustrated) as the attachment medium between the image sensor 40 and the circuit board 30, their alignment is also susceptible to change.

Failure to exactly align the lens 10 with the image sensor 40 causes the camera modules 1 and 1' to obtain a distorted image. The optically misaligned camera modules 1 and 1' degrade the reliability of the ADAS function that requires accuracy, such as a parking guide or an automatic driving function. Before affixing the lens 10 and image sensor 40 together, precise optical alignment is preferably performed therebetween. For accurate optical alignment, a master chart (not illustrated), including a test pattern for calibration, may be disposed of in front of the lens 10, and 6-axis optical alignment may be performed by determining an alignment error by using the image sensor 40.

Upon completion of the optical alignment and when polymer adhesives 91 and 92 previously applied to the coupled parts or junctions are cured, the lens 10 and the image sensor 40 are finally affixed together. FIG. 1A illustrates the lens barrel 110 and the front housing 20 when assembled before optical alignment, and FIG. 1B illustrates the front housing 20 and the circuit board 30 when assembled before optical alignment. The polymer adhesives 91 and 92 may be applied between the rear of the front housing 20 and the circuit board 30 as illustrated at FIG. 1A, or between the front of the front housing 20 and the rear of the lens barrel 110 as illustrated at FIG. 1B.

The polymer adhesives 91 and 92 may be a material that is UV-cured or heat-cured. Alternatively, the polymer adhesives 91 and 92 may be subjected first to UV curing and then to heat curing. Specifically, the polymer adhesives 91 and 92 are provisionally cured first by the UV curing to affix the lens 10 and the image sensor 40 together, and the cameras 1 and 1' are removed from an optical alignment platform (not illustrated), and then heat-cured in an oven to complete the polymer curing.

UV curing proceeds fast, but when applied to narrow assembly clearances of opaque parts such as the lens barrel 110, the front housing 20, and the circuit board 30, the UV curing may have a difficulty of illuminating the inside of the gaps with UV light. Heat curing takes a considerable amount of time to cure the polymer, and heat is transferred to peripheral parts in addition to the bonding site, causing thermal deformation and affecting the assembling precision of the final assembly. Nevertheless, as a method of fixing the parts after performing the six-axis optical alignment of the lens 10 and the image sensor 40, utilizing the polymer adhesives 91 and 92 is advantageous over a mechanical assembly method. This is because the required 6-axis optical alignment precision is so high to the extent that mechanical assembly is a hardly competent method due to its difficult stress effects to exclude.

On the other hand, UV-curable polymers and thermosetting polymers undergo polymerization and somewhat change their volume in the process of curing. This may cause residual stress to remain in the junctions and to distort the optical alignment. In addition, recent automotive cameras are required to be guaranteed to operate, for example, at a high temperature of 85° C. normally, which is higher than the conventional 75° C. When the adhesion site is close to the glass transition temperature of the polymer adhesives 91 and 92, a volume change may occur as the distance increases between the polymer chains of the polymer adhesives 91 and 92 which may be permanently deformed when exposed to high temperatures for a long time. As a result, with the resolution of the image sensor 40 and the operational temperature becoming higher, the use of the polymer adhesives 91 and 92 may not be desirable.

The above information disclosed in this Background section is only for enhancement of understanding of the background of the invention and, therefore, it may contain information that does not constitute prior art.

SUMMARY

Exemplary embodiments provide a vehicle camera module including a lens, a circuit board, a front housing, and a rear housing. The lens has a lens barrel and a plurality of lens elements assembled to the lens barrel. The circuit board includes an image sensor. The front housing has a front side to which the lens is assembled and a rear side to which the circuit board is assembled. The rear housing is coupled to the rear side of the front housing to seal the lens and the circuit board. Here, the front housing includes at least one or more posts protruding rearward and a pin protruding distally of each of the posts and having a smaller cross-sectional area than the post. The circuit board includes a plated through-hole for at least partially receiving each of the pins. The front housing and the circuit board are engaged in a pre-assembled state such that each pin and each plated through-hole have a predetermined assembly clearance, the lens, and the image sensor undergo an optical alignment in the pre-assembled state. The assembly clearance is soldered and solidified by using a laser solder-jet bonding process.

The optical alignment may include performing a fine movement of the front housing on which the lens is assembled or of the circuit board on which the image sensor is mounted in a 6-axis direction.

The assembly clearance may be defined by a gap between an end face of the post and a front face of the circuit board and a gap between the pin and the plated through-hole, and the assembly clearance may be configured to allow the fine movement in the 6-axis direction to carry out the optical alignment of the lens and the image sensor.

The plated through-hole may be electrolytically gold-plated.

The pin may be nickel-plated.

The laser solder-jet bonding process may include a process using an Sn-Bi-based solder ball.

The solder ball includes an Sn-58Bi alloy material.

The front housing and the circuit board may be engaged at a junction which undergoes a laser welding process.

The junction between the front housing and the rear housing may be formed as a cylindrical junction, and the laser welding process may be performed at a single focal position while rotating the front housing and the rear housing about a rotation axis of the cylindrical junction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
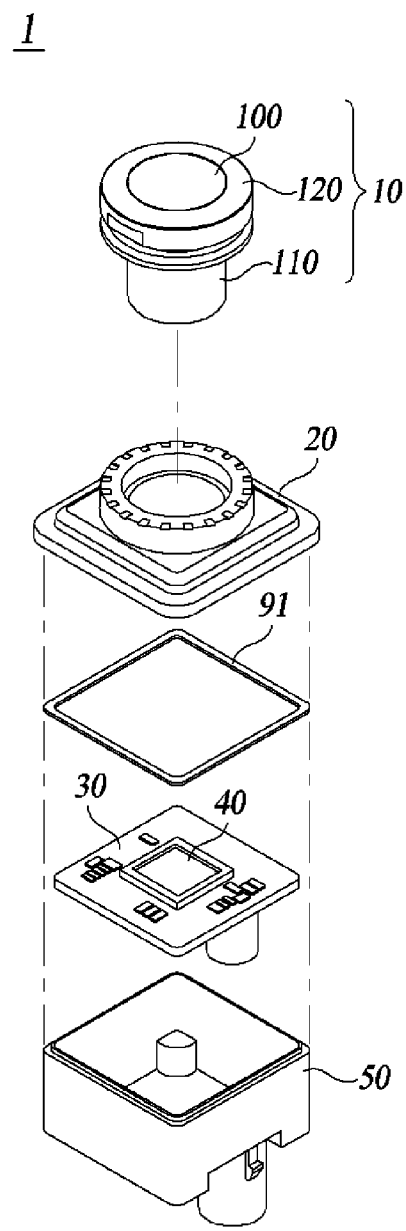
FIGS. 1A and 1B are exploded perspective views illustrating two conventional camera module assembly structures.
Figure 1B:
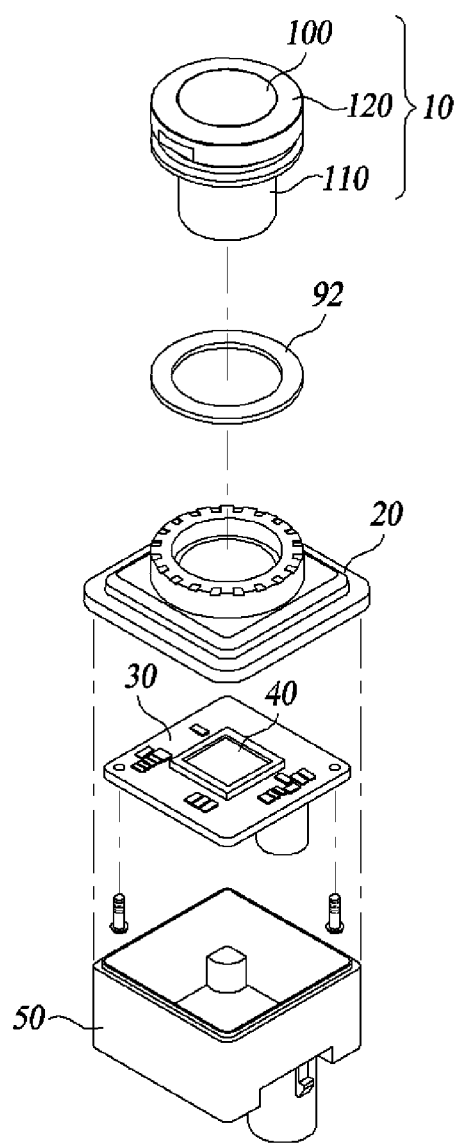

The invention is described more fully hereinafter with reference to the accompanying drawings, in which embodiments of the invention are illustrated. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

The inventive concepts in some embodiments seek to provide an assembly structure for a vehicle camera module, which can accurately fix a lens and an image sensor with complete optical alignment and obtain a high-quality image with a little deformation even in a high-temperature operation environment at a level of, for example, 85° C.

Some embodiments of the inventive concepts are described below with reference to the accompanying drawings. In the following description, like reference numerals would rather designate like elements, although the elements are illustrated in different drawings. Further, in the following description of the at least one embodiment, a detailed description of known functions and configurations incorporated herein will be omitted for the purpose of clarity and for brevity.

Additionally, various terms such as first, second, A, B, (a), (b), etc., are used solely for the purpose of differentiating one component from the other but not to imply or suggest the substances, the order or sequence of the components.

Throughout this specification, when a part "includes" or "comprises" a component, the part is meant to further include other components, not excluding thereof unless there is a particular description contrary thereto. The terms such as "unit", "module", and the like refer to units configured to process at least one function or operation, which may be implemented by hardware, software, or a combination thereof.

Various advantages and features of the present invention and methods accomplishing thereof will become apparent from the following description of embodiments with reference to the accompanying drawings. However, the present invention is not be limited to the embodiments set forth herein but may be implemented in many different forms. The present embodiments may be provided so that the disclosure of the present invention will be complete, and will fully convey the scope of the invention to those skilled in the art and therefore the present invention will be defined within the scope of claims. Like reference numerals throughout the description denote like elements.

Unless defined otherwise, it is to be understood that all the terms (including technical and scientific terms) used in the specification has the same meaning as those that are understood by those who skilled in the art. Further, the terms defined by the dictionary generally used should not be ideally or excessively formally defined unless clearly defined specifically. It will be understood that for purposes of this disclosure, "at least one of X, Y, and Z" can be construed as X only, Y only, Z only, or any combination of two or more items X, Y, and Z (e.g., XYZ, XYY, YZ, ZZ). Unless particularly described to the contrary, the term "comprise", "configure", "have", or the like, which are described herein, will be understood to imply the inclusion of the stated components, and therefore should be construed as including other components, and not the exclusion of any other elements.

A structure and a method of assembling a vehicle camera module may use a solder ball from a solder-jet in place of the polymer adhesives 91, 92 to fix together a subassembly of the front housing 20 and the image sensor 40 and another subassembly of the circuit board 30 and the image sensor 40. This structure has a high assembling precision, productivity, and operational temperature.

Figure 2:
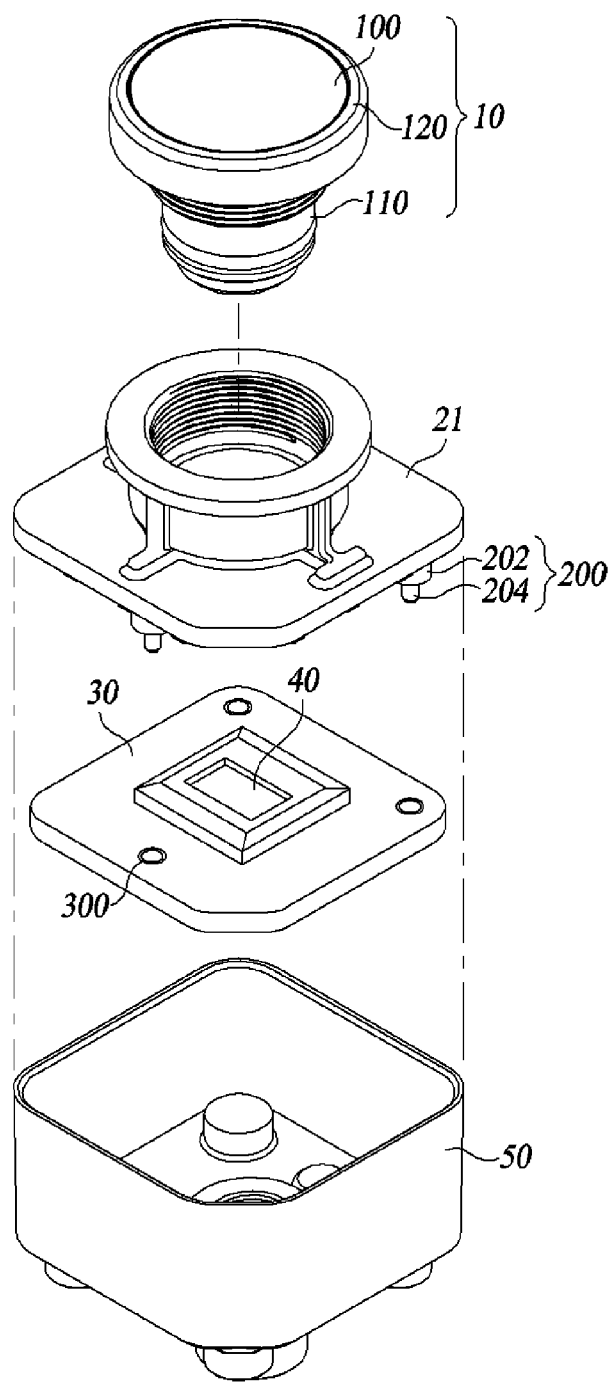
FIG. 2 is an exploded perspective view illustrating the components of a camera module according to a first embodiment of the inventive concepts.

FIG. 2 is an exploded perspective view illustrating the components of a camera module according to the first embodiment of the inventive concepts.

As illustrated in FIG. 2, a camera module 2 includes a lens 10, a front housing 21, a circuit board 30, and a rear housing 50. A plurality of pins 200 are included in the rear of the front housing 21, and a plated through-hole 300 configured to accommodate each of the pins 200 is formed in the circuit board 30. The pins 200 and plated through-holes 300 are temporarily coupled and may be formed to provide sufficient clearance for a 6-axis optical alignment to be performed. Each pin 200 may include a post 202 and a pin portion 204 mounted in or on the post 202.

Figure 3:
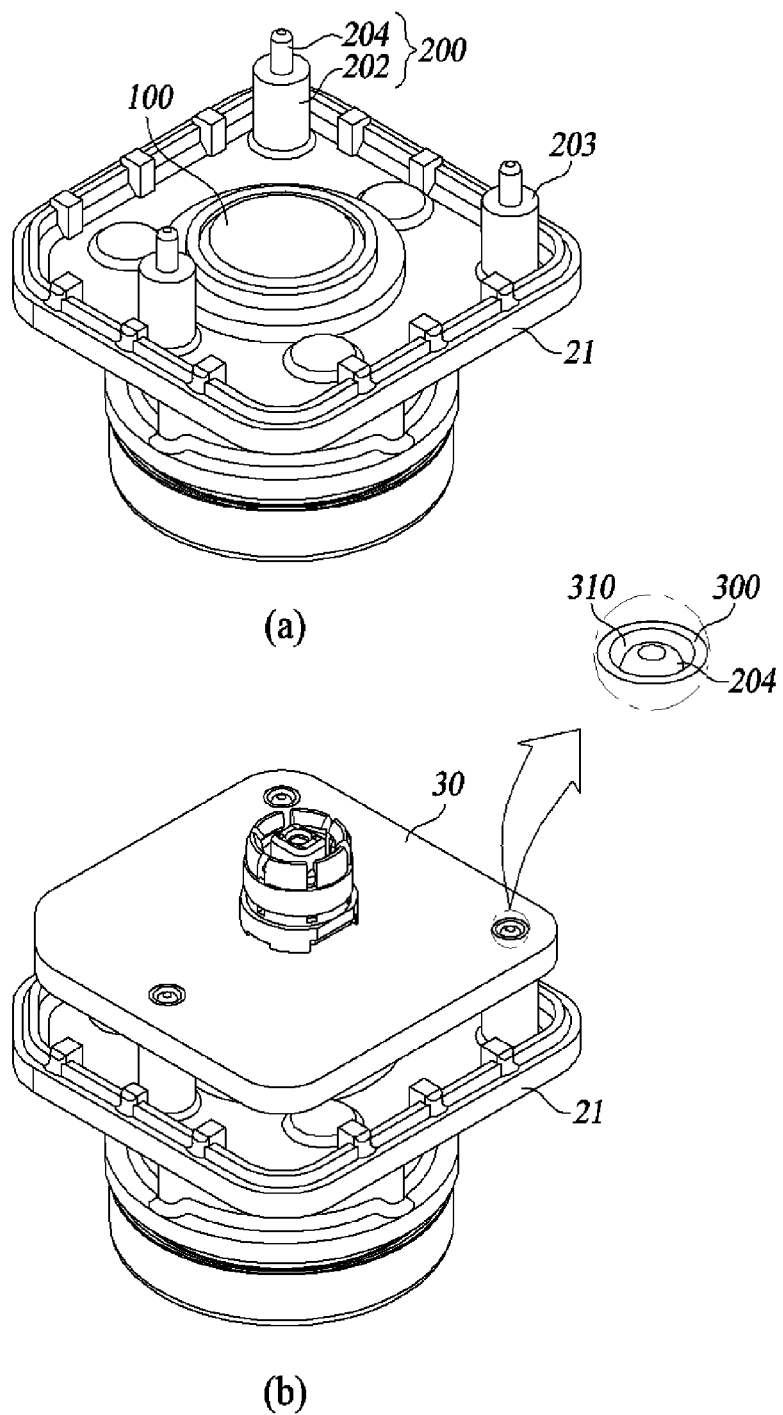
FIG. 3 is the bottom perspective views illustrating an assembly structure of the front housing and the circuit board, according to the first embodiment.

FIG. 3 is a bottom perspective views illustrating an assembly structure of the front housing 21 and the circuit board 30, according to the first embodiment.

As illustrated in FIG. 3, the plurality of pins 200 and the plurality of plated through-holes 300 are illustrated as being arranged in, but embodiments are not limited thereto, three pairs, and they may be formed in four or more, or smaller pairs. The through-holes 300 include a temporary coupling gap 310 to receive the pin portion 204 of the plurality of pins 200.

Figure 4:
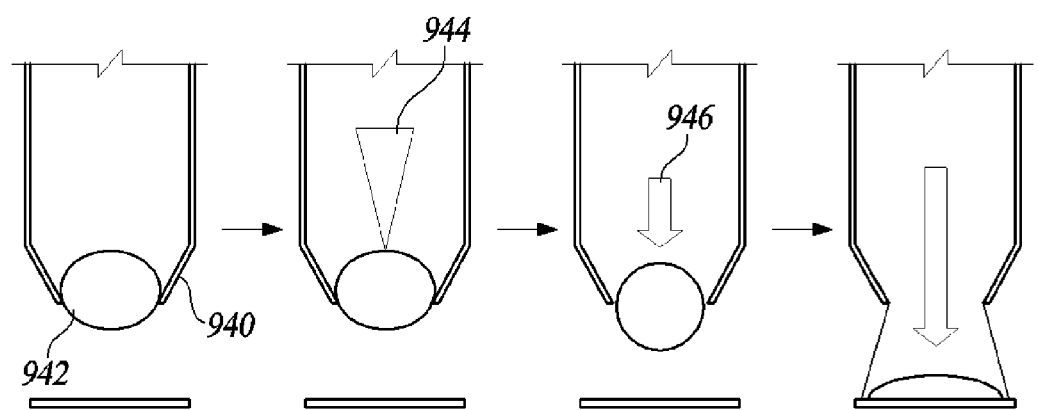
FIG. 4 is a conceptual view illustrating a laser solder-jet bonding process to fix a camera module assembly structure according to the first embodiment.

FIG. 4 is a conceptual view illustrating a laser solder-jet bonding process to fix a camera module assembly structure according to the first embodiment.

According to at least one embodiment of the inventive concepts, the temporary coupling gap 310 is fixed by a solder ball 942, which is melted by a laser 944 and injected by compressed air 946 through a laser solder-jet bonding process. As illustrated in FIG. 3 at (b), the circuit board 30 may be oriented rear side up with the lens 10 facing downward, and the image sensor 40 may be pre-assembled before the circuit board 30 is disposed on a platform (not illustrated) where 6-axis optical alignment is performed. Laser solder-jet bonding equipment (not illustrated) may be disposed spaced apart from the rear of the circuit board 30. The laser solder-jet bonding equipment may be mounted on a drive system (e.g., a robot arm, not illustrated) capable of a 5-axis movement configured to spray the solder ball 942 at an arbitrary angle from an arbitrary position. In addition, the laser solder-jet bonding equipment may be arranged in same number of components as the plated through-holes 300, thereby improving productivity by minimizing the movement of the drive system.

Figure 5:
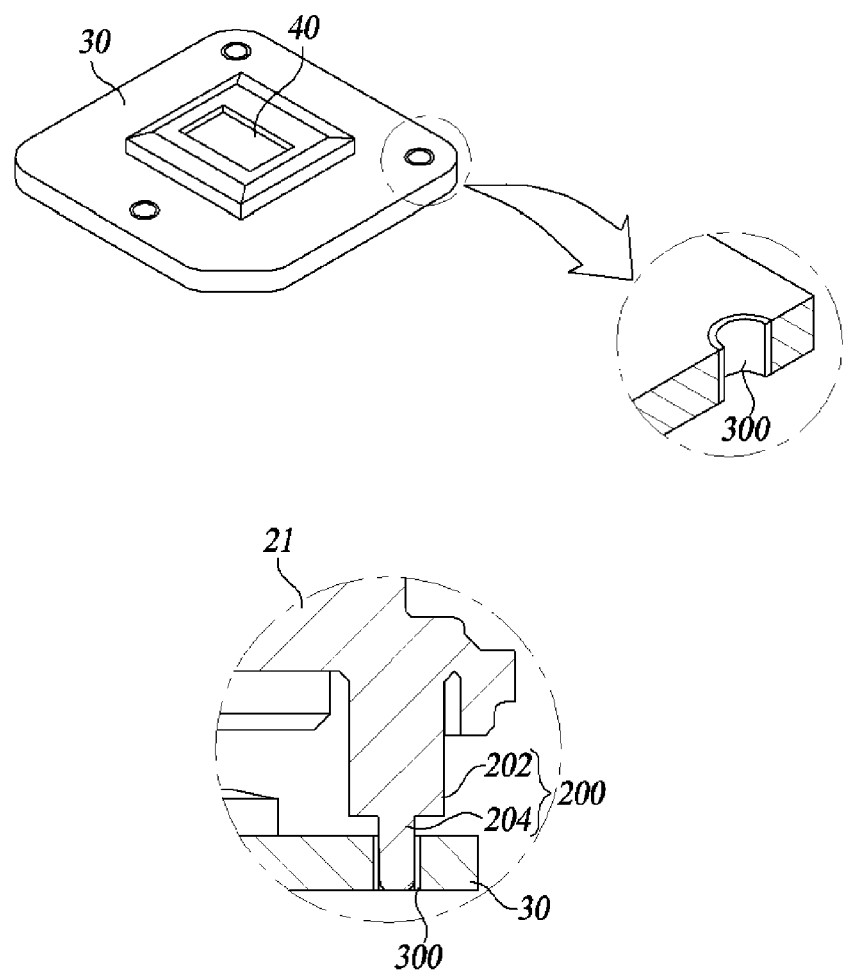
FIG. 5 illustrates pins of the front housing and plated through-holes of the circuit board, according to the first embodiment.

FIG. 5 illustrates the pins 200 of the front housing 21 and the plated through-holes 300 of the circuit board 30, according to the first embodiment.

Figure 6:
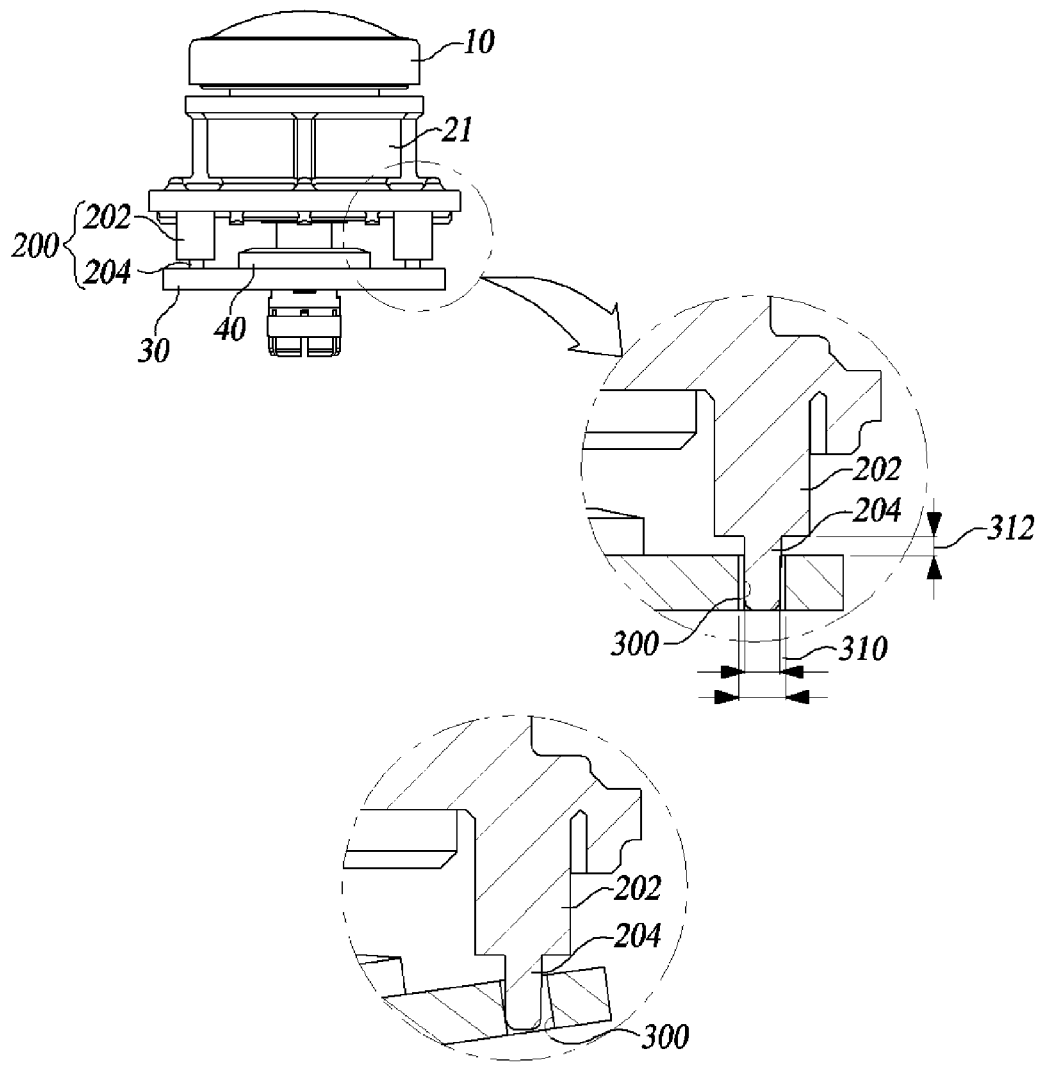
FIG. 6 illustrates the assembly tolerance between the pin and the plated through-hole, considering the optical alignment of the camera module according to the first embodiment.

FIG. 6 illustrates the assembly tolerance between the pin 200 including the pin portion 204 and the plated through-hole 300, considering the optical alignment of the camera module according to the first embodiment.

As illustrated in FIGS. 5 and 6, the circuit board 30 is formed with the plated through-holes 300 configured to accommodate the pins 200. The pins 200 are each formed into a two-stage cylindrical pillar protruding from the rear of the front housing 21. The pin 200 includes the pin portion 204 and the post 202 that has a cylindrical shape. Accommodated in the plated through-hole 300 of the circuit board 30, the pin portion 204 is formed at the end of the post 202 that has a larger diameter than the diameter of the pin portion 204. Thanks to this configuration, the solder ball 942, which is a liquid injected from a nozzle 940 (see FIG. 4) located at a position spaced from the rear of the circuit board 30 and penetrating the gaps between the plated through-holes 300 and the pins 200, may exclusively fill up a first gap 312 between an annular end surface 203 (see FIG. 3) of the post 202 and the front of the circuit board 30. The solder ball 942 may also fill a second gap 310 between the pin portion 204 and the inner surface of the plated through-hole 300.

The plated through-hole 300 according to at least one embodiment of the inventive concepts is used for the purpose of structurally coupling the front housing 21 and the circuit board 30, and it may be desirably subjected to, but not limited to, electrolytic gold-plating for its high peel strength. Further, the plurality of pins 200 may be nickel-plated to facilitate soldering.

The height of the post 202 may be selected in consideration of a focal length of the lens 10, a distance between the lens 10 and the image sensor 40, and the like. The 6-axis optical alignment is performed through fine translation in the X, Y, and Z directions, and fine rotation around the X, Y, and Z axes (for example, roll, yaw, and pitch). The gaps 310 and 312 between the plated through-hole 300 and the pin 200 may be selected in consideration of the required amount of 6-axis fine adjustment.

The 6-axis optical alignment may include, for example, disposing of the lens 10 front side down to face the lower portion of the optical alignment platform, arranging a master chart including a test pattern for calibration in front of the lens 10, analyzing the image obtained from the image sensor 40 mounted on the circuit board 30 to calculate the amount of positional correction, and accordingly moving the circuit board 30 by six axes into a corrected position.

Upon completion of the optical alignment, the assembly of the front housing and the circuit board is completed by solidifying the solder ball 942 after filling the gaps with a laser solder-jet bonding equipment. The size of the solder ball 942, the temperature before injection of the solder ball 942, the angle of incidence of the solder ball 942, the distance between the nozzle and the gap, etc. may be selected in consideration of the structure and thermodynamic characteristics of the pin 200 and the plated through-hole 300. The diameter of the solder ball 942 injected from the nozzle of the laser solder-jet bonding equipment may be, for example, 0.9 to 1 mm.

The solder ball 942 is heated by the laser 944 and injected from the nozzle 940 in a liquid state to locally increase the temperature of the portion to be soldered between the pin 200 and the plated through-hole 300 while filling up the gaps 310, 312 before it solidifies rapidly. This process is instantaneous and happens in a very short time, and the volume change of the solidified solder ball 942 according to the temperature drop to room temperature is at least one-third less than that of the polymer adhesives 91 and 92.

A preferred material of the solder ball 942 may be one having a low melting point, such as an Sn—Bi-based material having a melting point of 139° C. This is a relatively low temperature for a solder material but is sufficiently high to be applied to an automotive camera module for use at an operational temperature such as 85° C. Specifically, the material of the solder ball 942 may be an Sn-58Bi alloy. The thermal expansion coefficient of Sn-58Bi is $15\times10^{-6}/°$ C.

The Sn—Bi-based alloy has a spreading ratio of about 78 to 80% in the range of 220 to 250° C., and a contact angle of about 18° (degrees). The high spreading rate and the low contact angle are characteristics suitable for the penetration of the solder ball 942 into the temporary coupling gap 310 between the pin 200 and the plated through-hole 300. Such low-melting solders may be preferable because solder materials having a high melting point, such as 250° C. or higher, have disadvantages such as deterioration of the circuit board material, excessive growth of the metal compound layer at the solder joint, etc. leading to a deterioration of bonding strength and fatigue fracture.

In addition, the Sn—Bi-based solder material has a relatively higher yield strength than Sn—Pb or Sn—Ag—Cu-based solder materials. However, although the Sn—Bi-based solder material has a narrow elastic deformation region and slightly increased brittleness, the solder material may not be problematic in the present embodiment where the material is used to fill a narrow gap. Because the Sn—Bi material has a relatively wide solidification range, for example, 139 to 190° C., such a solder in solidification may prolong the duration of the coexistence of the solid phase with the liquid phase thereof, forming segregation which is highly likely to occur. However, with the present embodiment, the solder ball 942, which fills up the gaps 310 and 312 of the pin 200 and the plated through-hole 300, spreads thinly and cools relatively rapidly to get out of the solidification temperature range quickly and not to increase brittleness.

Meanwhile, the plurality of pins 200 and plated through-holes 300 may each have different clearance gaps after the 6-axis optical alignment. For example, a larger gap may be formed in a specific direction around the pin 200. In consideration of this, an inspection camera (not illustrated) that monitors the alignment of the pin 200 with the plated through-hole 300 may be additionally arranged at the rear of the circuit board 30 where the 6-axis optical alignment is performed. The inspection camera detects the state of the resultant gap formed by each of the pins 200 and the plated through-holes 300 after the alignment. The laser solder-jet bonding equipment may be configured to be capable of a 5-axis movement and to optimize the position and angle of the solder ball 942 to be sprayed in consideration of each gap identified by the inspection camera.

The fixing method using a laser solder-jet bonding process according to at least one embodiment of the inventive concepts is advantageous in the following respects compared to employing the polymer adhesives 91, 92.

When using the polymer adhesives 91, 92, the six-axis optical alignment platform is configured to include a dispenser (not illustrated) configured to dispense an adhesive and a UV illuminator (not illustrated) configured to irradiate ultraviolet light for UV curing. Further required is an oven (not illustrated) for heat curing to secure the required bonding strength. Whereas, the laser solder-jet bonding equipment, according to at least one embodiment of the inventive concepts, can be installed on a 6-axis optical alignment platform as long as the nozzle 940 can be located at a position properly spaced apart from the circuit board 30.

In particular, compared to the time required for adhesive application, UV curing, etc., the solder ball 942 allows the gap injection and solidification to be instantaneously completed so quickly and incomparable to the polymer adhesives 91 and 92. Therefore, utilizing the solder ball 942 significantly reduces the possibility of altering the alignment before and after the fixing process.

In general, compared to the solder jet process applied to an electrode pad on a flat surface or an exposed lead pin, the solder jet process performed in a gap is difficult to secure process quality. For example, where the assembly clearance is narrow, such as in at least one embodiment when assembling the camera module, the gap may not be easy to be uniformly filled with the solder ball 942. In addition, relative to a small electrode pad on a flat substrate for which a laser solder-jet bonding process is mainly employed, at least one embodiment of the inventive concepts, which may be used for the pins 200 having a higher heat capacity, possibly suffers from a cold solder joint. An improved form of assembly structure to ensure solder-jet quality is further described through the embodiments described below.

Figure 7A:
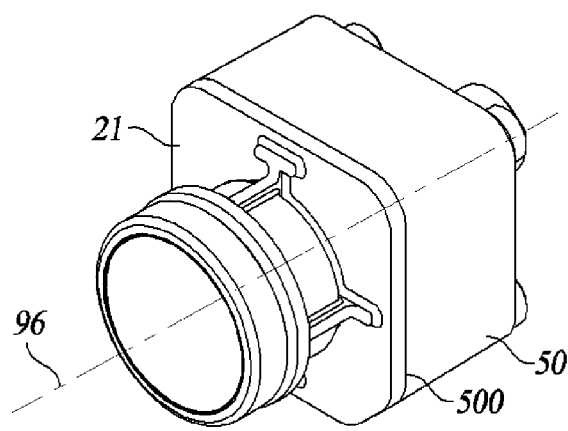
FIGS. 7A and 7B are perspective views illustrating a coupling method of two types of front housings and two types of rear housings, according to some embodiments of the inventive concepts.
Figure 7B:
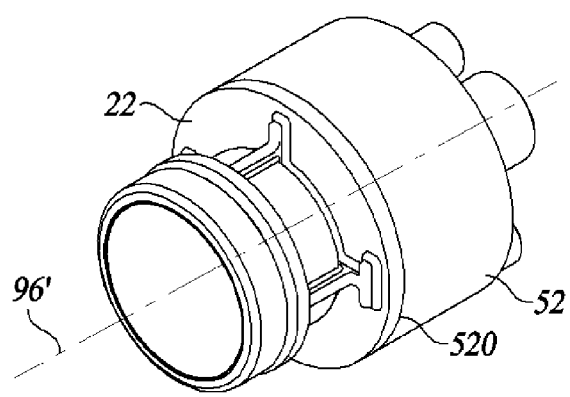

FIGS. 7A and 7B are perspective views illustrating a coupling method of two types of front housings and two types of rear housings, according to some embodiments of the inventive concepts.

Upon completion of the optical axis alignment of the lens 10 and the image sensor 40, the front housings 21, 22 and the rear housings 50, 52 are assembled, establishing mating portions or junctions 500, 520 therebetween, which are then sealed, thereby completing the assembly of the vehicle camera modules 2 and 2'. For example, when the front housings 21, 22, and the rear housings 50, 52 are made of metal, their assembly boundaries at the junctions 500, 520 may be sealed completely by laser-welding.

As illustrated in FIG. 7A, the junction 500 of the front housing 21 may be approximately square, wherein the camera module 2 may be rotated about an optical axis 96, and the distance of the laser source to the weld of the junction 500 may be adjusted according to the rotation of the camera module 2 so that the focal position of the laser conforms to the weld position. On the other hand, the camera module 2' as illustrated in FIG. 7B may have the front housing 22 and the rear housing 52, which are externally formed in a cylindrical shape. The camera module 2' may be rotated around an optical axis 96', when the laser may be fired standstill obviating the operation of making an adjustment to the laser focal position to carry out the welding, thereby simplifying the sealing process.

Figure 8:
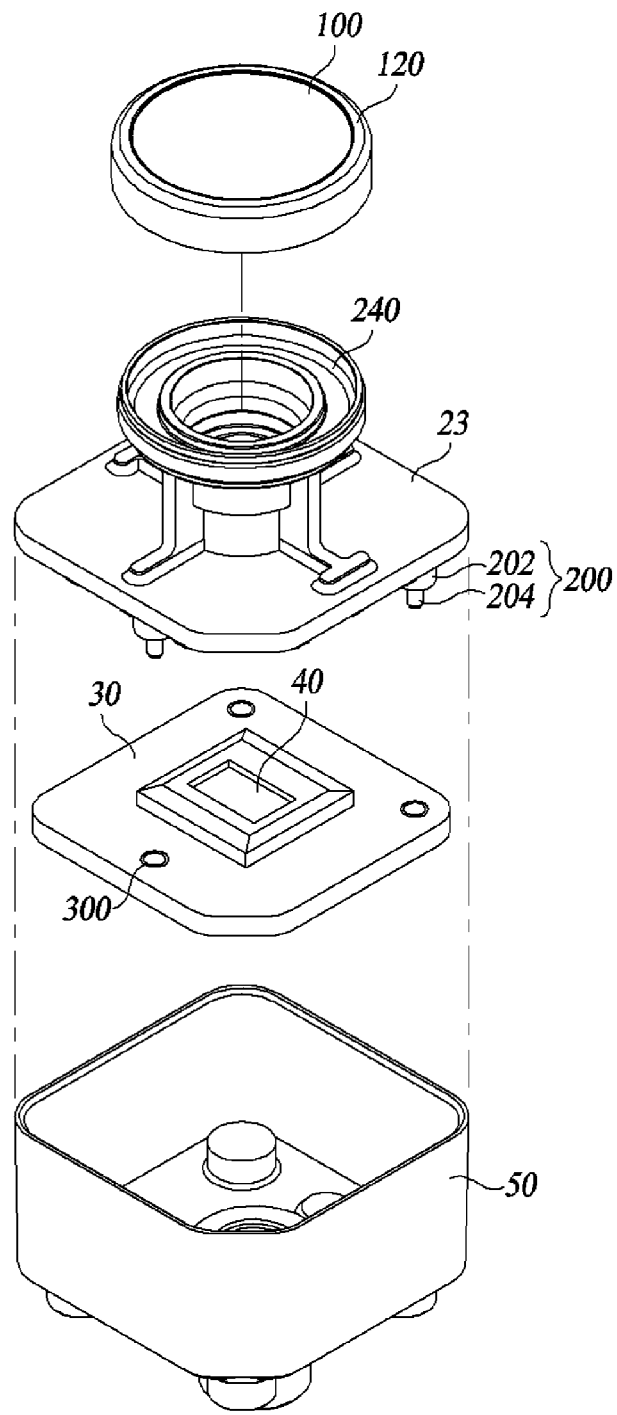
FIG. 8 is an exploded perspective view illustrating the components of a camera module according to a second embodiment of the inventive concepts.

FIG. 8 is an exploded perspective view illustrating the components of a camera module according to a second embodiment of the inventive concepts.

As illustrated in FIG. 8, the second embodiment of the inventive concepts provides a front housing 23, which is integrally formed with a lens barrel structure 230 corresponding to the lens barrel 110. The plurality of lens elements 100 is mounted on the lens barrel structure 230 provided in the front housing 23, and a retainer 120 is assembled to the front of the front housing 23 so that the front housing 23 and the lens 10 are assembled as a whole.

Figure 9A:
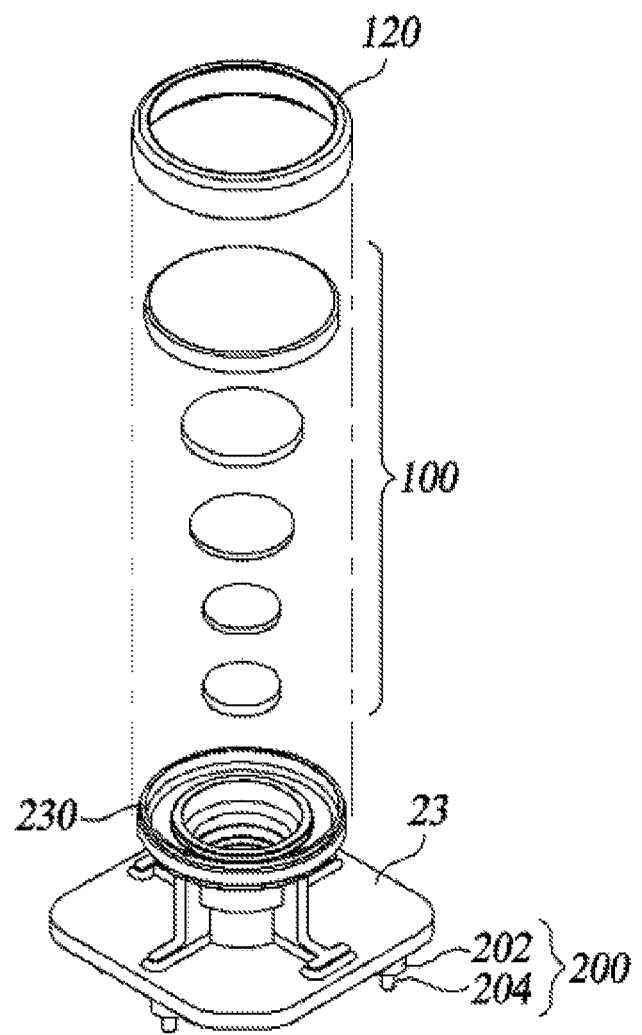
FIGS. 9A and 9B are an exploded perspective view and a longitudinal cross-sectional view illustrating a front housing internally formed with an integral structure corresponding to a lens barrel according to the second embodiment.
Figure 9B:
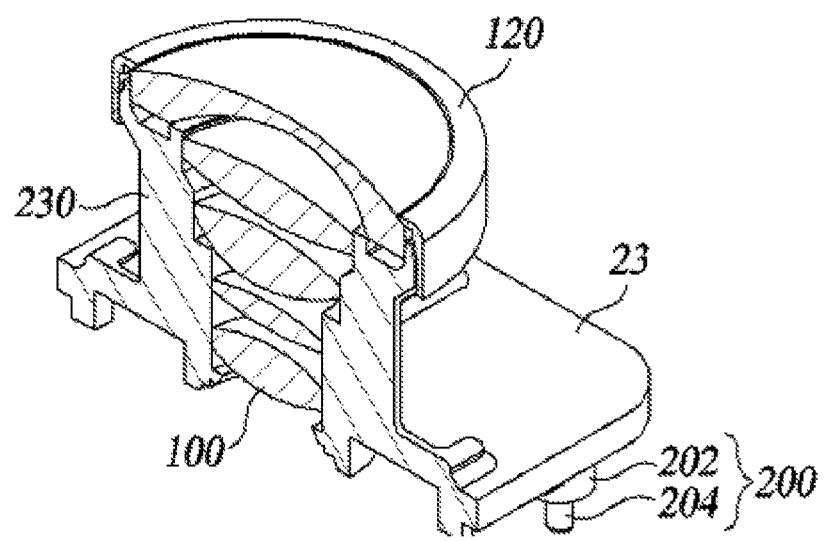

FIGS. 9A and 9B are an exploded perspective view and a longitudinal cross-sectional view illustrating a front housing 23 internally formed with an integral structure corresponding to a lens barrel according to the second embodiment.

As illustrated in FIGS. 9A and 9B, the lens 10 is assembled directly to the front housing 23, thereby simplifying the assembly process and reducing assembly errors compared to the first embodiment of the inventive concepts. In the first embodiment, the lens elements 100 are assembled to the lens barrel 110, which is then assembled to the front housing 23 before the lens elements 100 undergo optical axis alignment with the image sensor 40. In the second embodiment, the lens elements 100, after being assembled to the lens barrel structure 230 of the front housing 23, undergoes the optical axis alignment with the image sensor 40, thereby reducing assembly parts and consequently decreasing assembly errors.

Meanwhile, although not illustrated, the plurality of lens elements 100 may be divided into a first lens group and a second lens group. Of the lens elements 100, the front-half first lens group may be configured in various forms so that the lens has different angles of view. The back-half second lens group may have the same shape as the front-half first lens group. Therefore, making changes to the first lens group for the same second lens group, the lens may be configured to have various angles of view.

Usually, in a zoom lens, a plurality of lens elements may be grouped and moved in different subsets, thereby changing the angle of view of the lens. Alternatively, the angle of view may be changed by reconfiguring some lens subsets within the zoom lens.

On the other hand, the camera module for a vehicle, which is generally a wide-angle lens, compresses an image toward the rear of the lens. In other words, assembly error of the lens elements disposed at the rear of the lens may have a greater influence on the quality of the image captured.

In at least one embodiment of the inventive concepts, the second lens group is assembled to the lens barrel structure 230 of the front housing 23 to provide a common module, and the first lens group is assembled in various matching configurations to the angles of view of the lens, to the common module, thereby facilitating manufacture of the lens module of various angles of view.

Figure 10:
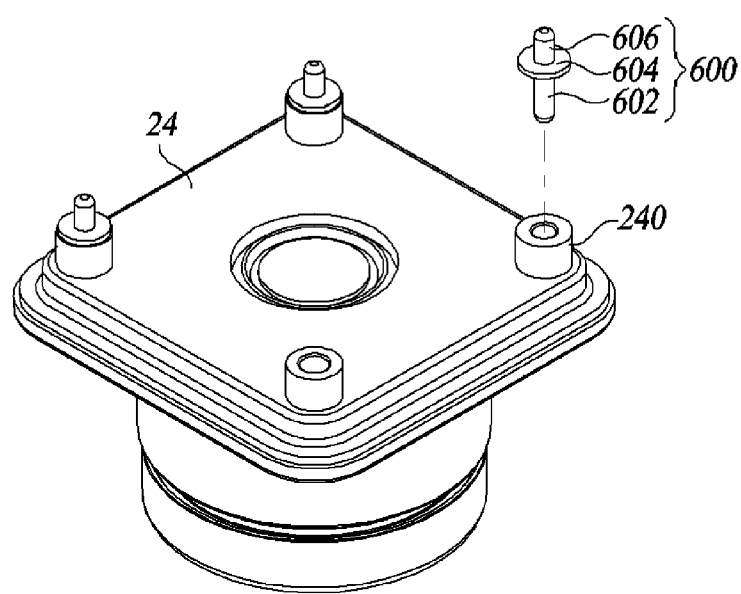
FIG. 10 is a perspective view illustrating example pin components separately assembled to a front housing according to a third embodiment of the inventive concepts.

FIG. 10 is a perspective view of example pin components separately assembled to a front housing according to a third embodiment of the inventive concepts.

As illustrated in FIG. 10, the third embodiment of the inventive concepts provides a front housing 24, which is configured to have pins 600 separately manufactured to be inserted into bosses 240 of the front housing 24. The pin 600 may be in the form of a plunger pin, including a boss mating portion 602, a flange portion 604, and a hole mating portion 606. The bosses 240 are configured to have a cylindrical pillar formed at the rear of the front housing 24 and a hole formed at the end of the cylindrical pillar configured to mate with the pin 600.

According to at least one embodiment of the inventive concepts, the front housing 24 with the lens 10 assembled and the circuit board 30 including the image sensor 40 upon completion of the optical alignment, are bonded together by a laser solder-jet bonding process. To ensure the soldering quality uses a proper temperature rise of the two material surfaces at the soldering site. If the surface temperature does not rise to an appropriate level due to excessive heat transfer of the soldering site, cold solder joint may be generated, which may not provide an adequate bonding strength.

The junction between the pin 600 and the boss 240 substantially narrows the area where heat transfer is made. Even with the front housing 24 made of a metallic material, the junctions between the separate pins 600 and the front housing 24 may have lower thermal conductivity than that of a front housing with integral pins. Accordingly, the mating portions between the separate pins 600 and the bosses 240, according to the third embodiment, may delay heat transfer as compared to the case where the pins are integrally formed into the front housing 24. Therefore, the separately inserted pin 600 can substantially reduce the heat capacity of the soldered portion, and the solder ball 942 can appropriately raise the temperature of the soldered portion, thereby preventing a cold solder joint. In addition, the pin 600 can be surface finished, unlike the front housing 24, to provide suitable surface properties for solder-jet bonding.

Meanwhile, because the pin 600 may be separately inserted, the front housing 24 may not necessarily be a metallic material suitable to perform soldering. For example, the front housing 24 can be a non-metallic material such as plastic. When the front housing 24 is formed of plastic material, the heat transfer from the pin 600 during soldering can be made smaller, and consequently, cold solder joint can be prevented.

FIGS. 11A-11D illustrate example pin components in the form of inserts to be coupled to the boss 240 of the front housing 24 according to the third embodiment.

Figure 11A:
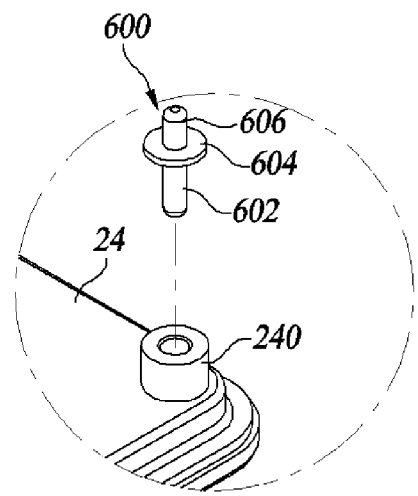
FIGS. 11A, 11B, 11C and 11D illustrate example pin components in the form of inserts to be coupled to a boss of the front housing according to the third embodiment.
Figure 11B:
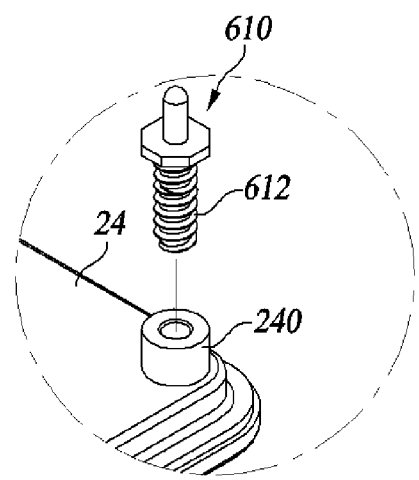
Figure 11C:
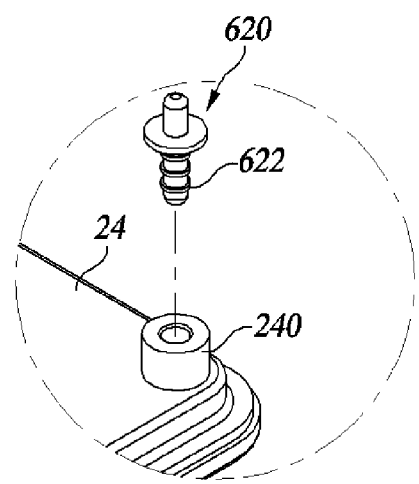
Figure 11D:
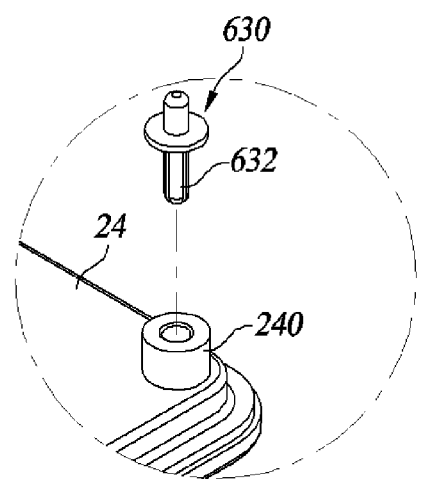

As described above, the pin 600 may be in the form of the plunger pin, including the boss mating portion 602, the flange portion 604, and the hole mating portion 606 configured to mate with a plated through-hole. As illustrated in FIG. 11A, the pin 600 may have an insertion coupling with the cylindrical pillar type of the boss 240 of the front housing 24, which is implemented by the boss mating portion 602 using an interference fitting. FIGS. 11B-11D illustrate alternatives to the pin 600, such as pins 610, 620, and 630 having a threaded mating portion 612, an ultrasonically bonded boss mating portion 622, and a press-fitted boss mating portion 632 that is axially parted to be elastically deformed for a press-fitting, respectively for the insertion couplings with the boss 240.

Figure 12A:
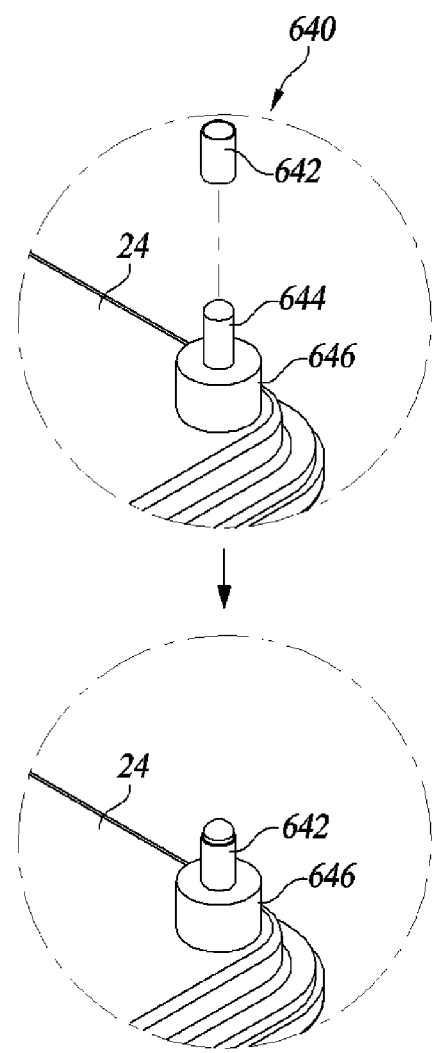
FIGS. 12A and 12B illustrate an example plated shell being inserted and coupled to pin portions protruding from the front housing according to the third embodiment.
Figure 12B:
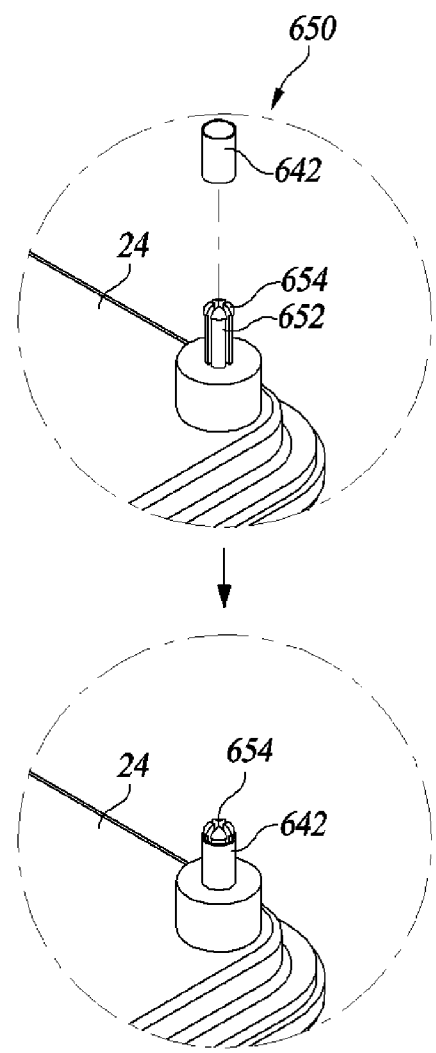

FIGS. 12A and 12B illustrate an example plated shell being inserted and coupled to pins protruding from the front housing 24, according to the third embodiment.

FIG. 12A illustrates a pin assembly 640 provided, including a plated bush 642 and a pin portion 644 which is formed on a post 646 extending from the front housing 24 and is adapted to be inserted in the plated bush 642 so that the plated bush 642 is sleeved over and fixed to the pin portion 644 through a caulking joint performed at the distal end of the pin portion 644. Yet further alternatively, FIG. 12B illustrates a pin assembly 650 provided, including a plated bush 642 and a pin portion 652 which is formed on a post extending from the front housing 24 and is axially parted to be elastically deformed so that the plated bush 642 is sleeved over and fixed to the pin portion 652 through a hook structure 654 formed distally of the pin portion 652. In these embodiments, the heat capacity of the plated bush 642 is lower than that of the embodiment of FIG. 11, which is advantageous for the laser solder-jet bonding process.

Figure 13A:
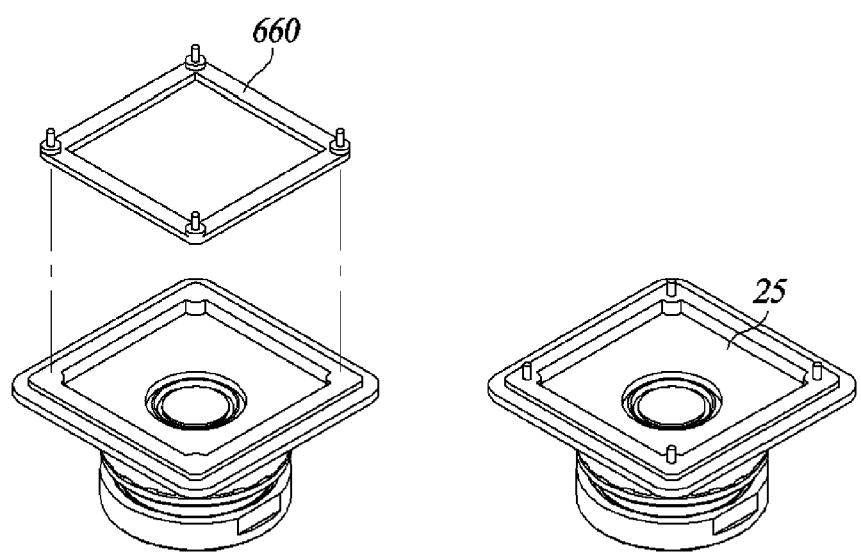
FIGS. 13A and 13B illustrate example pins that are multi-component injected into the front housing according to the third embodiment.
Figure 13B:
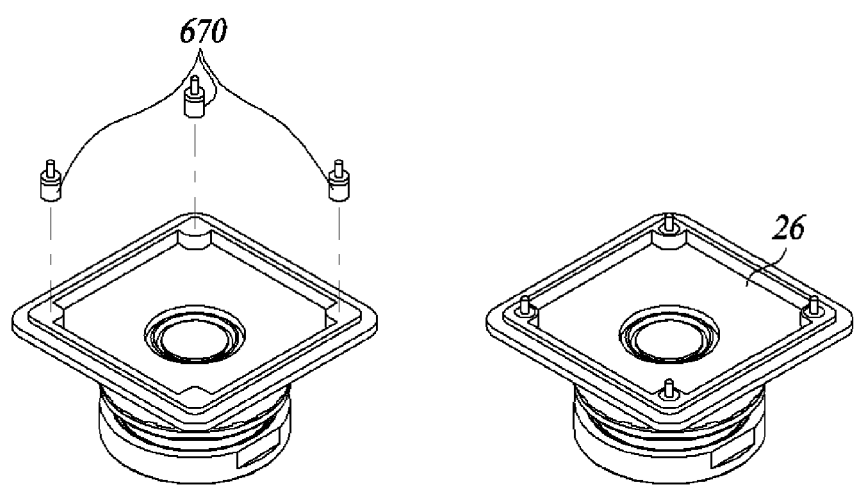

FIGS. 13A and 13B illustrate example pins that are multi-component injected into the front housing according to the third embodiment.

FIGS. 13A and 13B illustrate front housings 25 and 26 which may be injection molded, for example, from a plastic material, so that they have pin parts 660 and 670 which are pre-fabricated from a metallic material and then molded to be embedded in the front housings 25 and 26, respectively by insert injection molding. The pin part 660 illustrated in FIG. 13A is formed with a plurality of integral pins, whereas the pin member 670 illustrated in FIG. 13B is composed of a plurality of separate pins.

Figure 14:
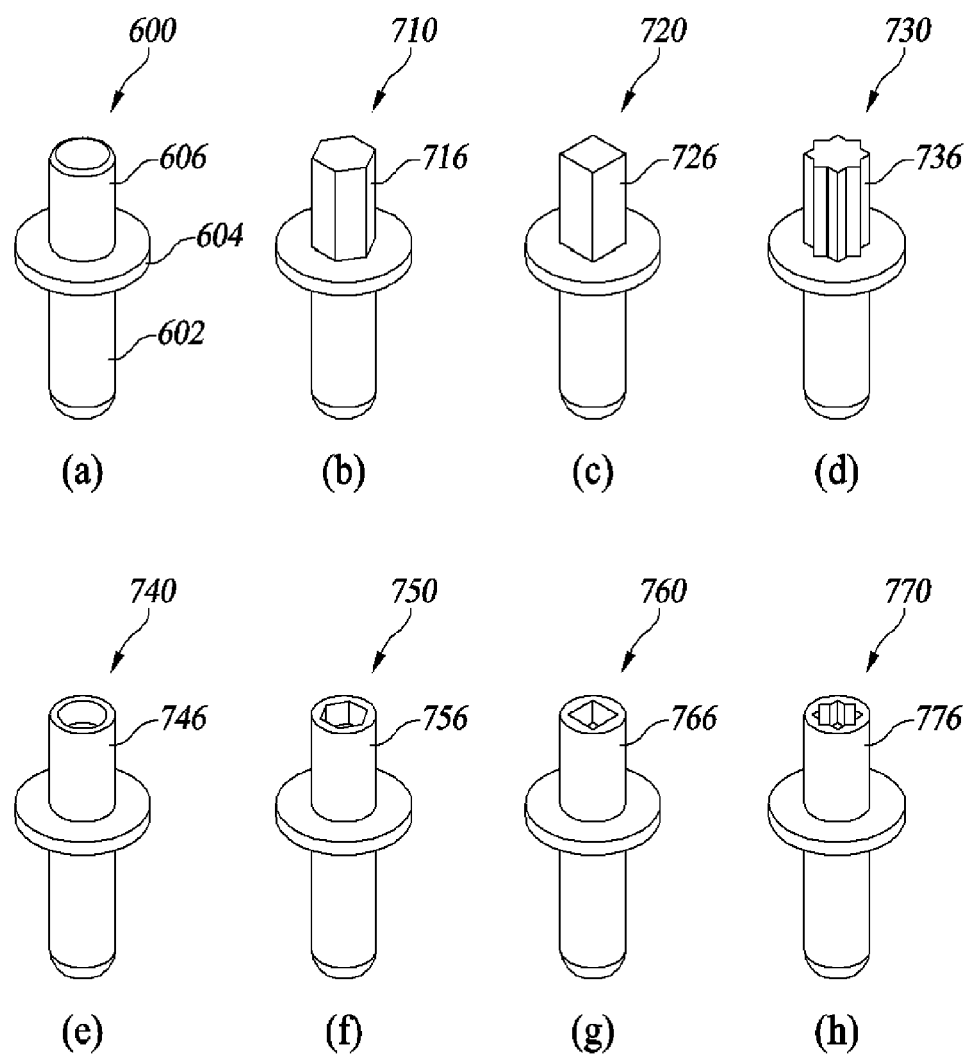
FIG. 14 illustrates example pins having different polygonal head shapes according to a fourth embodiment of the inventive concepts.

FIG. 14 illustrates example pins having different polygonal head shapes according to a fourth embodiment of the inventive concepts.

In comparison with FIG. 14 at (a) corresponding to FIG. 10 in which the pin 600 has the cylindrical hole mating portion 606 configured to mate with the plated through-hole, FIG. 14 from (b) to (d) illustrates pins 710, 720, and 730, which are formed to be separately assembled to the front housing 24 and to include hole mating portions configured to engage the circuit board 30 and having polygonal cross-sections other than the cylindrical counterpart. Their polygonal formations in cross-section allow the hole mating portions 716, 726, and 736 of the pins 710, 720, and 730 to be accommodated with locally widened gaps formed, in the circular plated through-hole 300 of the circuit board 30 as illustrated in FIG. 8. The laser solder-jet bonding equipment may be controlled to inject the liquid solder ball 942 into the locally widened gap.

FIG. 14 from (e) to (h) illustrates pins 740, 750, 760, and 770 which are separately manufactured and assembled to the front housing 24 and to include hole mating portions 746, 756, 766, and 776 configured to engage the circuit board 30 and having contoured internal cavities. Reducing the volume of the hole mating portions 746, 756, 766, and 776 of the pins 740, 750, 760, and 770 by using the cavities can reduce the heat capacity of the soldered portions of the pins 740, 750, 760, and 770 to prevent cold solder joint and consequently improve the soldering quality. On the other hand, the cavities may conform to standard tools that can be used when assembling the pin by inserting a hex wrench, a star wrench, a Phillips screwdriver, or the like in the cavities.

FIG. 15 illustrates example pins having head shapes with the cross-section decreasing toward the end, according to a fifth embodiment of the inventive concepts.

Figure 15A:
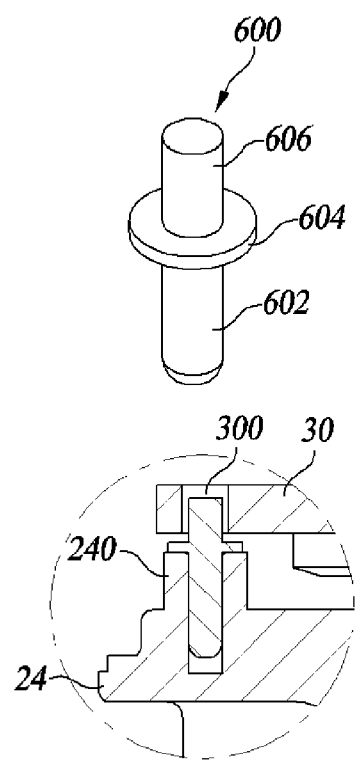
FIGS. 15A, 15B, 15C and 15D illustrate example pins having head shapes with the cross-section decreasing toward the end, according to a fifth embodiment of the inventive concepts.
Figure 15B:
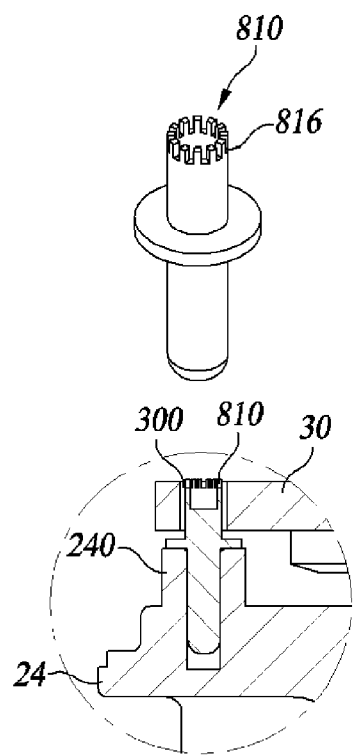
Figure 15C:
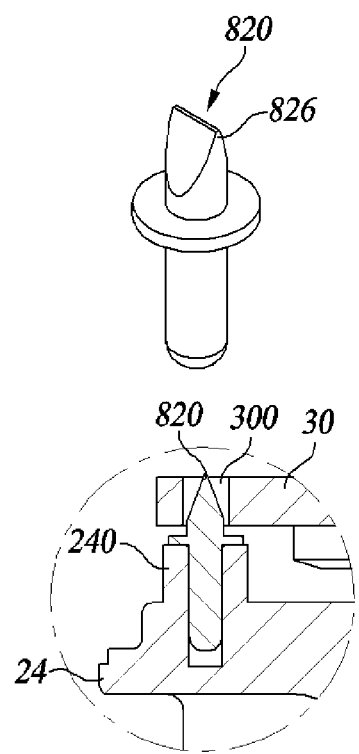
Figure 15D:
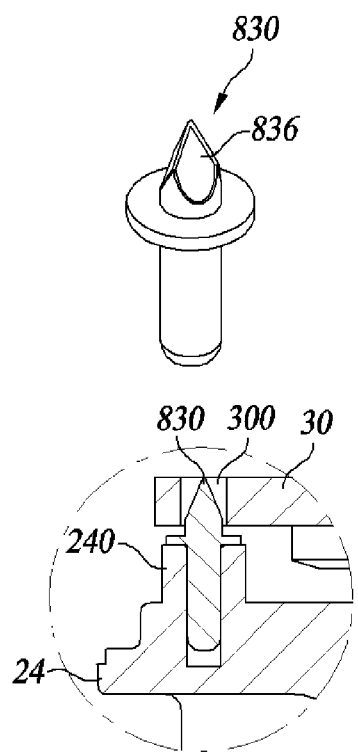

Compared with FIG. 15A corresponding to FIG. 10 illustrating the pin 600, from FIG. 15B to 15D illustrates pins 810, 820, and 830 according to the fifth embodiment, having hole mating portions 816, 826, and 836 configured to mate with the plated through-hole, which may be formed so that the pins 810, 820, and 830 when inserted in the plated through-hole 300 establish gaps therewith that widen gradually or are wider on the side facing toward the nozzle of the laser solder-jet bonding equipment.

As illustrated in FIG. 15B the hole mating portion 816 of the pin 810 may have a shape substantially similar to a crown. In other words, the hole mating portion 816 has an uneven or jagged edge profile along its outer circumferential surface to substantially widen the area thereof where the solder ball 942 enters.

As illustrated in FIG. 15C, the hole mating portion 826 of the pin 820 has two inclined surfaces that converge into one edge from the distal end of the hole mating portion 826 to provide, for example, a flat head screwdriver shape. Another modified form is illustrated in FIG. 15D as the hole mating portion 836 of the pin 830, with three inclined surfaces that converge into one edge from the distal end of the hole mating portion 836.

In addition, although not illustrated, the hole mating portion of the pin may be distally formed into a Phillips screwdriver head. In addition to this, it should be understood that the pin according to the fifth embodiment includes other shapes which form a gap suitable to solder between the hole mating portion and the plated through-hole, while the hole mating portion becomes narrower toward the distal end to allow the liquid solder ball 942 to easily enter the gap.

Figure 16:
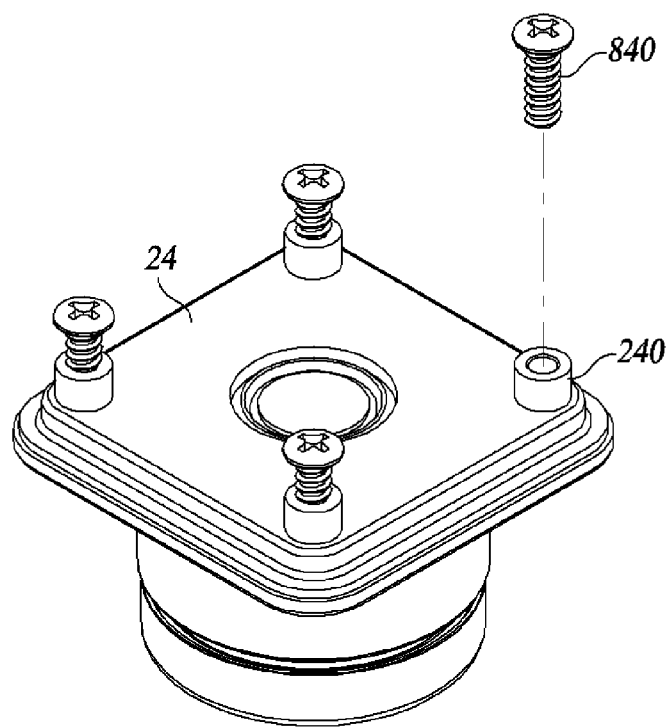
FIG. 16 illustrates an assembly structure with screws tightened to bosses of a front housing according to a sixth embodiment of the inventive concepts.

FIG. 16 illustrates an assembly structure with screws tightened to bosses of a front housing according to a sixth embodiment of the inventive concepts.

As illustrated in FIG. 16, the front housing, according to the sixth embodiment of the inventive concepts, includes holes formed at the rear to allow the screws to be engaged. The holes may be formed terminally of cylindrical posts protruding behind the front housing. The holes may be formed with a thread in advance or may be assembled while forming a thread on the inner circumferential surface of unthreaded holes when the screws are coupled.

The screw may have its threaded portion pre-applied with a screw locker, for example, Loctite®, before being inserted into the screw hole to prevent loosening of the screw after assembly. Loctite® is preferably not applied to the area to be soldered after optical alignment so that the solder ball 942 fills between the thread and the plated through-hole to achieve proper soldering.

Figure 17:
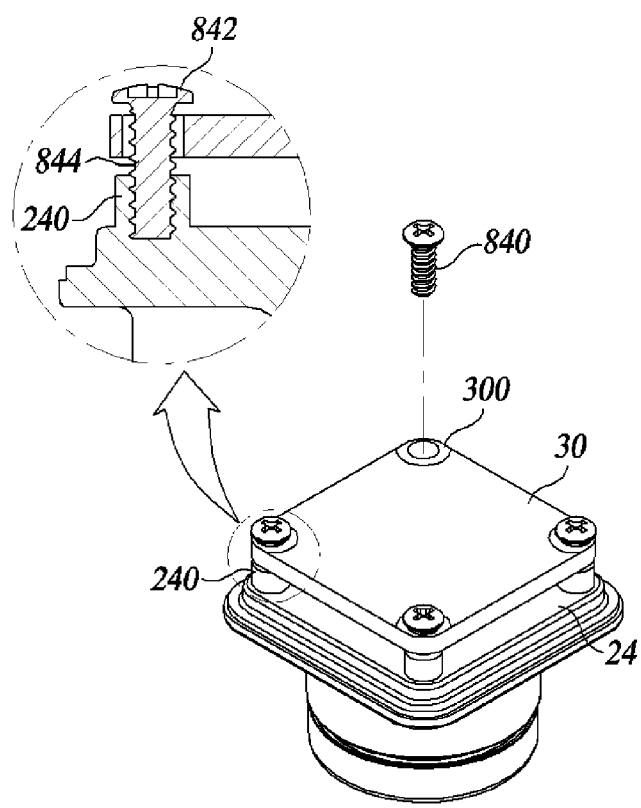
FIG. 17 illustrates the assembly tolerance between a plated through-hole and the screw, according to the sixth embodiment.

FIG. 17 illustrates the assembly tolerance between a plated through-hole and the screw, according to the sixth embodiment of the inventive concepts.

According to the sixth embodiment, after the circuit board 30 is disposed at the rear of the front housing 24, screws 840 are inserted through the plated through-holes to be threaded into holes or screw holes of the bosses 240. As illustrated in FIG. 17, the screws 840 are fastened to a level that provides sufficient clearance required for optical alignment between the front housing 24 and the circuit board 30. The screw 840 and the circuit board 30 are firmly fixed to each other by being soldered with a solder ball 942 introduced into a gap between a screw head 842 and the rear surface of the circuit board 30. The screw 840 may be a material that is easily soldered, for example, a brass material.

According to the sixth embodiment of the inventive concepts, the screw 840 to be fixedly soldered is made of a metallic material, so the front housing 24 need not necessarily be a metallic material. In addition, the process of threading the screw 840 into the boss 240 of the front housing 24 may be automated. Therefore, the assembly structure, according to the sixth embodiment, provides the assembly process with an unprecedently high level of productivity.

On the other hand, the sixth embodiment illustrates utilizing the screw 840 with a screw head, but a set screw may also be used. When utilizing a socket set screw for the set screw, for example, the cavity provided in the head portion as described in the fourth embodiment of FIG. 14 can help to reduce the heat capacity at the soldering portion to prevent a cold solder joint. In addition, the set screw can be threaded in advance into the boss 240 of the front housing 24 before the circuit board is pre-assembled to facilitate process design.

Figure 18A:
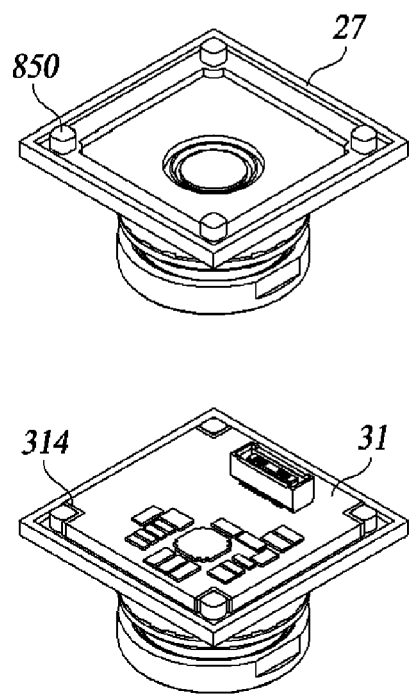
FIGS. 18A and 18B are perspective views illustrating example assembly structures using edges of a circuit board, according to a seventh embodiment of the inventive concepts.
Figure 18B:
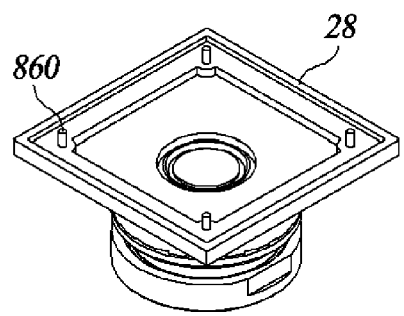
Figure 18B:
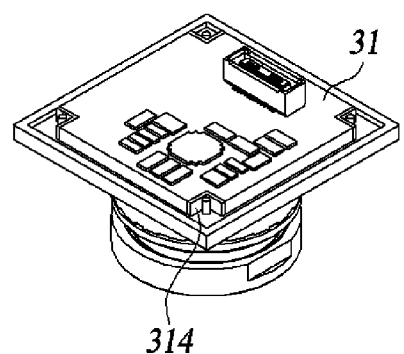

FIGS. 18A and 18B are perspective views of example assembly structures using edges of a circuit board, according to a seventh embodiment of the inventive concepts.

As illustrated in FIGS. 18A and 18B, the camera module assembly structures according to the seventh embodiment are respectively configured to have a circuit board 31 and front housings 27, 28 so that the outer rim of the circuit board 31 and the inner sides of the front housings 27, 28 form gaps to be fixedly soldered by a laser solder-jet bonding process. The circuit board 31 is formed to be accommodated with an assembly clearance for optical alignment, in a pocket portion formed at the rear of the front housings 27, 28. After arranging the front housings 27, 28 in which the lens 10 is assembled on the 6-axis optical alignment platform, the circuit board 31 with the image sensor 40 mounted is disposed to perform the optical alignment. After the optical alignment is completed, the assembling gap is soldered by solder balls 942 being introduced at a plurality of positions.

As illustrated in FIG. 18A, a plurality of posts 850 having a generally rectangular cross-section are formed at the rear of the front housing 27. The circuit board 31 has corners contoured to maintain assembly clearances between the respective posts 850, and the corners that define the assembly clearances have plated side walls 314 configured to facilitate soldering. The assembly clearances formed by the plurality of posts 850 and the plated side walls 314 are soldered by the solder ball 942 after optical alignment.

As illustrated in FIG. 18B, at the rear of the front housing 28, a plurality of posts 860 may be each provided in a cylindrical form. The circuit board 31 has two plated side walls 314 formed at each corner thereof so that the outer circumferential surface of the post 850 which is cylindrical and the two plated side walls 314 which are planar form an assembly clearance that is the narrowest at two points and getting wider as the distance from the two points increases.

The laser solder-jet bonding process may be introduced with an oblique angle toward the assembly clearance in consideration of this minimum assembly clearance, the diameter of the post 850, and the diameter of the solder ball 942. For example, the injection angle of the solder ball 942 from the nozzle 940 may be adjusted such that the points at which the introduced solder ball 942 first contacts the post 850 and the plated side wall 314 have the same distance from the position where the minimum assembly clearance is formed. The solder ball 942 enters the assembly clearance from the wide area to the narrow area thereof, while uniformly transferring heat to the post 850 and the plated side wall 314 unit it fills up the inside of the assembly clearance and then solidifies to improve soldering quality.

On the other hand, although not illustrated, to reduce the heat capacity of the member to be soldered, the seventh embodiment may also provide the posts 850, 860 with a cavity terminally recessed inward therefrom in a similar manner to the fourth embodiment.

Figure 19:
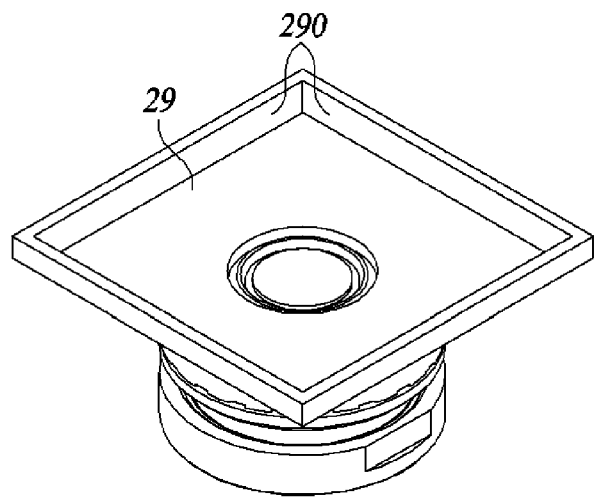
FIG. 19 is perspective views illustrating a modification of the assembly structure of the seventh embodiment illustrated in FIGS. 18A and 18B, which utilizes side portions of the circuit board.
Figure 19:
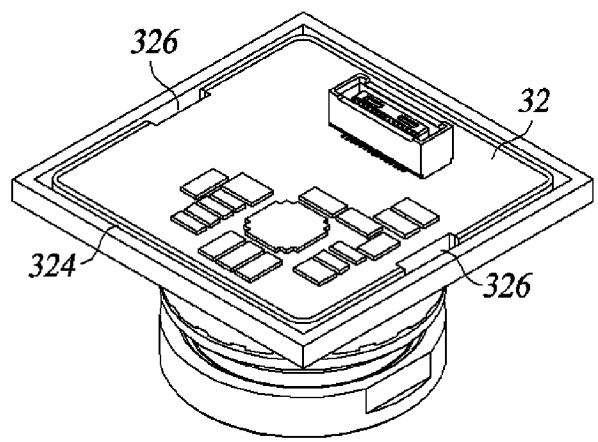

FIG. 19 is perspective views illustrating a modification of the assembly structure of the seventh embodiment illustrated in FIGS. 18A and 18B, which utilizes side portions of the circuit board.

FIG. 19 in (a) and (b) illustrates a front housing 29 provided with inner walls 290 and a circuit board 32 provided with side edges 324, wherein the inner walls 290 and the side edges 324 form gaps therebetween to be fixedly soldered.

In the seventh embodiment and its modified embodiment, a six-axis movement mechanism (not illustrated) with a grip or other components to move the circuit boards 31 and 32 in the process of optical alignment may be configured to grip at least two portions 326 of the side portions of the circuit boards 31 and 32. The solder balls 942 may fixedly solder the gaps except the portions 326 for the grip.

The seventh embodiment can simplify the rear structure of the front housings 27, 28, 29, thereby securing more space for components and circuits within the circuit boards 31, 32 and effectively transferring heat generated from the circuit boards 31, 32 to the front housings 27, 28, 29, to improve the heat dissipation performance of the circuit boards 31 and 32.

Figure 20A:
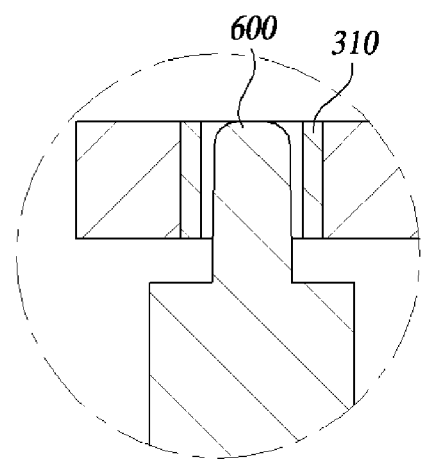
FIGS. 20A, 20B, and 20C illustrate example assembly structures including plated through-holes formed to have gaps widening as they approach the entry of the solder ball, according to an eighth embodiment of the inventive concepts.
Figure 20B:
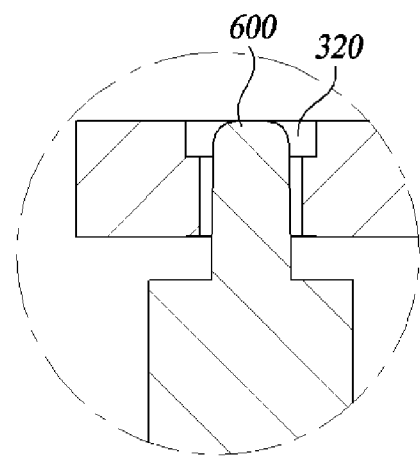
Figure 20C:
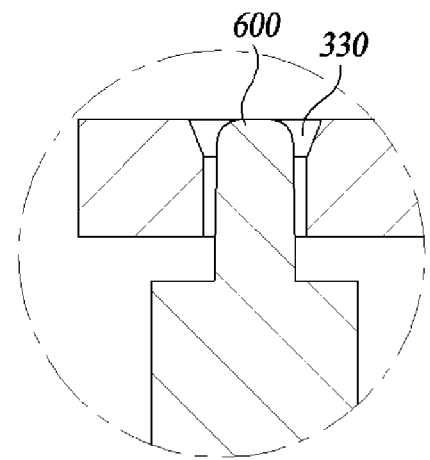

FIGS. 20A-20C illustrate example assembly structures including plated through-holes formed to have gaps widening as they approach the entry of the solder ball, according to an eighth embodiment of the inventive concepts.

FIG. 20A illustrates a pin 600 having a cylindrical shape and a plated through-hole 300 having a cylindrical hole shape which may cooperatively form a uniform gap as a whole. On the other hand, FIGS. 20B and 20C illustrate plated through-holes 320 and 330 according to the eighth embodiment of the inventive concepts, which may be formed with, for example, a counterbore and a countersink, respectively so that a gap opening into which the solder ball 942 is injected is formed to be wider.

A circuit board, including an image sensor, is generally made of a multi-layer board and has a structure of at least six layers or more. The non-cylindrical plated through-holes 320 and 330 with features such as a counterbore, and a countersink may be formed by laminating a multi-layer substrate and processing with a suitable tool, followed by plating. Alternatively, similar to the method of forming buried vias or blind vias, the multiple layers may be formed with through-holes of different diameters to be joined into the plated through-hole 300 in a single substrate manufacturing step to form the non-cylindrical plated through-holes 320 and 330.

The eighth embodiment of the inventive concepts provides distinctive plated through-holes 320, 330 that have a wide entrance for the solder ball 942 to enter the gap and clearance narrowing toward the inside of the gap. The liquid solder ball 942 sprayed from the nozzle of the laser solder-jet bonding equipment will have an overall droplet shape, and the diameter of the solder ball 942 may be larger than the gap into which it is injected. By forming the gap opening larger than the inner gap, the solder ball 942 is allowed to enter the gap easily.

The solder ball 942 injected by the solder-jet method enters the gap with a predetermined speed. Because the volume of the gap decreases as the solder ball 942 initially filled up the gap entry further proceeds to the interior of the gap, the injected solder ball 942 will spread to the entrance direction and its left and right sides.

In some other cases, when the solder ball 942 is separated to the left and right of the pin and fills up divided targets, a soldering defect may occur corresponding to a cold shut of casting at the innermost side of the gap. Cold shut refers to a casting defect that occurs when the tips of molten materials that have been processed in different paths are cooled early and cannot be combined into a liquid phase at the point where they meet each other. According to this embodiment, the gap entry has a relatively large volume to delay the solidification, so that the solder ball 942 is filled to the innermost part of the gap without solidification to prevent a cold shut, resulting in improved soldering quality. In addition, forming a gap to have a wider injection entrance and its volume decreased toward the inside of the gap allows the solidification of the solder ball 942 to be uniformly progressed overall, thereby improving the soldering quality.

In the camera module for a vehicle according to at least one embodiment of the inventive concepts, after an optical axis is aligned with an image sensor, a solder ball fills up and solidifies a temporary coupling gap that is a gap between temporarily coupled parts is formed by using a laser solder-jet bonding process. Those temporary coupling gaps are formed between a plurality of pins formed at the rear of the front housing and plated through-holes of a circuit board accommodating these pins. The gaps are filled with a solder ball, which is a metallic material and is instantaneously solidified, thereby guaranteeing an alignment state of the optical axis before and after the assembly process and providing a high operational temperature.

In addition, the soldering quality is finally improved by selecting the location, angle, number, etc. of the solder jets to spray based on information on the temporary coupling gap after optical alignment.

Although exemplary embodiments of the inventive concepts have been described for illustrative purposes, those skilled in the art will appreciate that various modifications, additions, and substitutions are possible, without departing from the various characteristics of the disclosure. Therefore, exemplary embodiments of the inventive concepts have been described for the sake of brevity and clarity. Accordingly, one of ordinary skill would understand the scope of the disclosure is not limited by the above explicitly described embodiments but by the claims and equivalents thereof.

What is claimed is:

1. A vehicle camera module, comprising:
a lens having a lens barrel and a plurality of lens elements assembled to the lens barrel;
a circuit board including an image sensor;
a front housing having a front side to which the lens is assembled and a rear side to which the circuit board is assembled; and
a rear housing coupled to the rear side of the front housing to seal the lens and the circuit board, wherein:
the front housing includes one or more posts protruding rearward and a pin protruding distally from each of the posts and having a smaller cross-sectional area than the post,
the circuit board includes a plated through-hole configured to at least partially receive each of the pins,
the front housing and the circuit board are engaged in a pre-assembled state with a first gap, and the lens and the image sensor undergo an optical alignment in the pre-assembled state, and
the first gap and the second gap are soldered and solidified by using a laser solder-jet bonding process,
the plated through-hole having a flange shape such that a lower portion of the plated through-hole furthest from the front housing has a larger width than an upper and middle portion of the plated through-hole that are closer to the front housing than the lower portion of the plated through-hole, such that a gap opening is formed within the plated through-hole into which solder is to be injected therein.

2. The vehicle camera module of claim 1, wherein the optical alignment comprises:

performing a fine movement of the front housing on which the lens is assembled or of the circuit board on which the image sensor is mounted in a 6-axis direction.

3. The vehicle camera module of claim 2, wherein the first gap and the second gap are configured to allow the fine movement in the 6-axis direction to carry out the optical alignment of the lens and the image sensor.

4. The vehicle camera module of claim 1, wherein the plated through-hole is electrolytically gold-plated.

5. The vehicle camera module of claim 1, wherein the pin is nickel-plated.

6. The vehicle camera module of claim 1, wherein the laser solder-jet bonding process comprises:
a process using an Sn—Bi-based solder ball.

7. The vehicle camera module of claim 6, wherein the solder ball comprises:
an Sn-58Bi alloy material.

8. The vehicle camera module of claim 1, wherein the front housing and the circuit board are engaged at a junction which undergoes a laser welding process.

9. The vehicle camera module of claim 8, wherein the junction between the front housing and the rear housing is formed as a cylindrical junction, and the laser welding process is performed at a single focal position while rotating the front housing and the rear housing about a rotation axis of the cylindrical junction.

10. The vehicle camera module of claim 1, wherein a head of each of the pins protruding distally from each of the posts has a polygonal shape to enable each of the pins to be tightened or loosened via a tool.

11. A vehicle camera module comprising:
a lens having a lens barrel and a plurality of lens elements assembled to the lens barrel;
a circuit board including an image sensor;
a front housing having a front side to which the lens is assembled and a rear side to which the circuit board is assembled; and
a rear housing coupled to the rear side of the front housing to seal the lens and the circuit board, wherein:
the front housing includes one or more posts protruding rearward and a pin protruding distally from each of the posts and having a smaller cross-sectional area than the post,
the circuit board includes a plated through-hole configured to at least partially receive each of the pins,
the front housing and the circuit board are engaged in a pre-assembled state with a first gap between an end face of each post and the circuit board, and a second gap between each pin and each plated through-hole, and the lens and the image sensor undergo an optical alignment in the pre-assembled state,
the first gap is formed between an end face of each post and the circuit board spaced apart from each other in an axial direction of each post,
the second gap is formed to be spaced apart in a direction perpendicular to the axial direction between each pin and each plated through-hole, and
the first gap and the second gap are soldered and solidified by using a laser solder-jet bonding process,
the front housing includes one or more bosses within which the one or more posts protrude rearward, wherein the one or more posts comprise one or more plunger pins that are fitted into the respective one or more bosses of the front housing, and wherein the one or more plunger pins are not integrally formed on the front housing.

12. The vehicle camera module of claim 11, wherein the front housing is formed of plastic material.

13. The vehicle camera module of claim 11, further comprising a plated bush formed as a sleeve over each of the pins, wherein each of the plated bushes is fixed to the respective pin through a caulking joint performed at the distal end of each of the pins.

* * * * *